US011973472B2

(12) United States Patent
Myoung et al.

(10) Patent No.: US 11,973,472 B2
(45) Date of Patent: Apr. 30, 2024

(54) DIGITALLY ASSISTED RADIO FREQUENCY TRANSMITTER

(71) Applicant: NEWRACOM, INC., Lake Forest, CA (US)

(72) Inventors: Seong-Sik Myoung, Irvine, CA (US); Ryun Woo Kim, Yongin (KR)

(73) Assignee: NEWRACOM, INC., Irvine, CA (US)

( * ) Notice: Subject to any disclaimer, the term of this patent is extended or adjusted under 35 U.S.C. 154(b) by 137 days.

(21) Appl. No.: 17/567,641

(22) Filed: Jan. 3, 2022

(65) Prior Publication Data

US 2022/0216834 A1 Jul. 7, 2022

Related U.S. Application Data

(60) Provisional application No. 63/134,153, filed on Jan. 5, 2021.

(51) Int. Cl.
*H03F 1/32* (2006.01)
*H03F 3/24* (2006.01)
*H04B 1/04* (2006.01)

(52) U.S. Cl.
CPC ......... *H03F 1/3247* (2013.01); *H03F 1/3294* (2013.01); *H03F 3/24* (2013.01); *H04B 1/0475* (2013.01); *H03F 2200/451* (2013.01); *H03F 2201/3233* (2013.01); *H04B 2001/0425* (2013.01)

(58) Field of Classification Search
CPC ........ H03F 1/3247; H03F 1/3294; H03F 3/24; H03F 2200/451; H03F 2201/3233; H04B 1/0475; H04B 2001/0425

USPC .......................................................... 375/149
See application file for complete search history.

(56) References Cited

U.S. PATENT DOCUMENTS

| | | | |
|---|---|---|---|
| 2010/0172398 A1* | 7/2010 | Sekino | H03F 1/34 375/221 |
| 2013/0156083 A1 | 6/2013 | Jechoux et al. | |
| 2015/0180518 A1* | 6/2015 | Whittaker | H03F 1/56 330/296 |
| 2019/0319585 A1 | 10/2019 | Lam et al. | |

OTHER PUBLICATIONS

International Search Report for PCT/US22/70047 dated May 12, 2022.
Invitation to Pay Additional Fees, for PCT/US22/70047, dated Mar. 1, 2022.

\* cited by examiner

*Primary Examiner* — Kevin M Burd

(57) ABSTRACT

A radio frequency (RF) transmitter includes an analog RF power amplifier and a digital Dynamic Error Vector Magnitude (DEVM) correction module. The DEVM correction module compensates for time-dependent variations in an instantaneous gain of the RF power amplifier. The time-dependent variations may be variations that occur during a period the RF power amplifier is turned on. The RF transmitter may further include one or more analog baseband circuits, and one or more respective baseband digital predistortion (DPD) modules that compensate for amplitude modulation to amplitude modulation (AM2AM) nonlinearities in the analog baseband circuits. The digital DEVM correction module and baseband DPD modules may each include respective look-up tables having values determined by respective calibration operations.

19 Claims, 5 Drawing Sheets

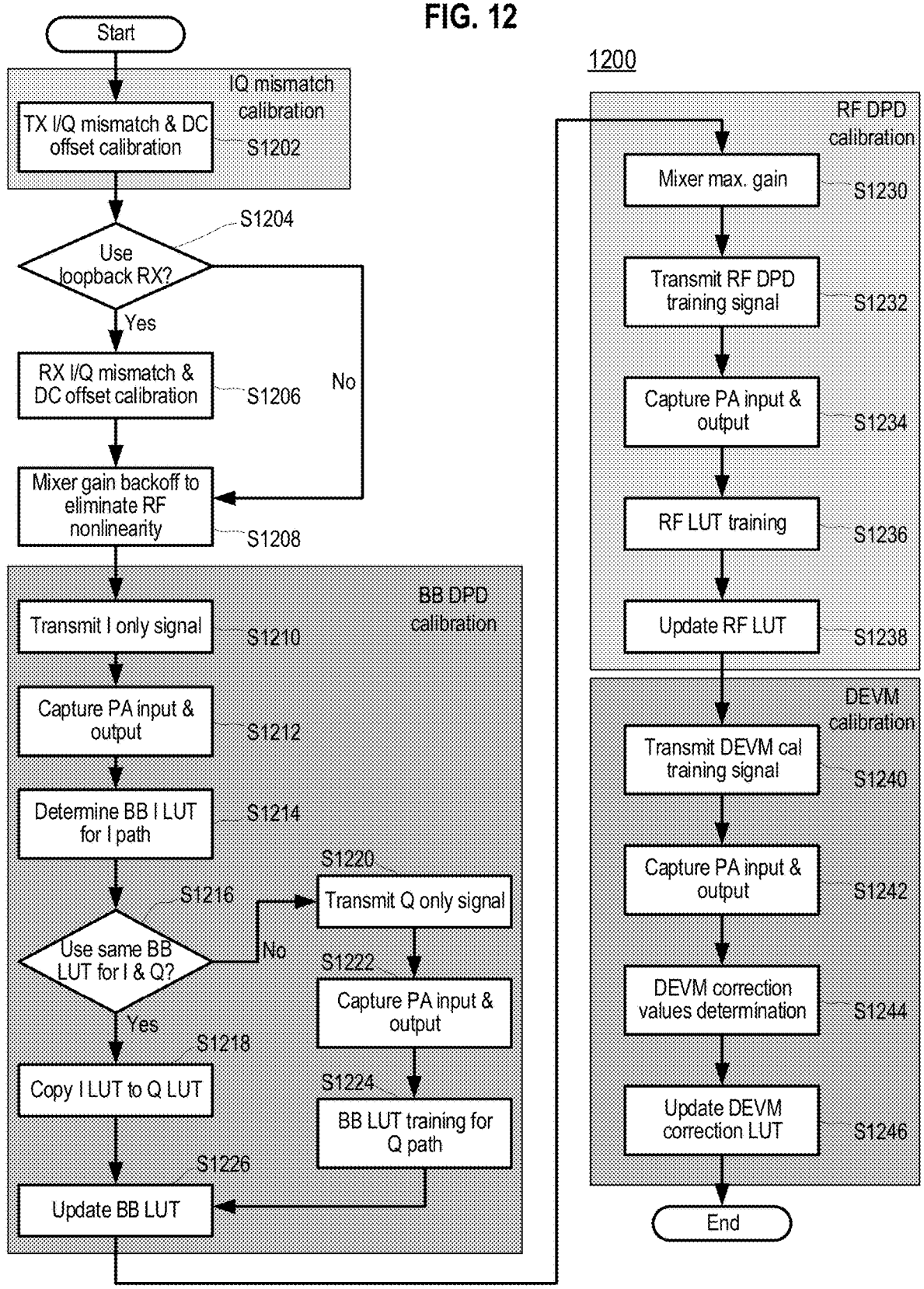

DIGITALLY ASSISTED RADIO FREQUENCY TRANSMITTER

CROSS-REFERENCE TO RELATED APPLICATION

This application claims the benefit of U.S. Provisional Application No. 63/134,153, filed on Jan. 5, 2021, the contents of which are incorporated herein by reference.

BACKGROUND

Modern Internet-of-Things (IoT) applications require low power consumption and small silicon area consumption to achieve longer battery life and low cost. Because of this stringent requirement for low power and small silicon area consumption, performance is often scarified as a tradeoff. In RF transmitter designs, this has resulted in significant impairment of linearity and increases in instantaneous gain variation.

Nonlinearity may be defined as a gain variation dependent on the input signal. For the ideal case, the gain of each circuit and of an entire chain of circuits would be constant over the entire range of design levels of the input signal. However, the gain of real analog blocks such as power amplifiers is usually not constant with variations in the value of the input signal; in power amplifiers, this is due to the large-signal operation of power amplifiers.

In traditional RF design, the power amplifier has been considered the single dominant source of nonlinearity, and Digital Pre-Distortion (DPD) of the input signal is a popular and effective solution to compensate for degraded power amplifier linearity because DPD has a simple realization with excellent performance improvement.

RF nonlinearity includes Amplitude-Modulation-To-Amplitude-Modulation (AM2AM) nonlinearity and Amplitude-Modulation-To-Phase-Modulation (AM2PM) nonlinearity. A modulated input signal with proper spectrum shaping and Error Vector Magnitude (EVM) and with a reduced Peak-to-Average Power Ratio (PAPR) may have the spectrum shape and EVM performance degraded due to RF nonlinearity of the power amplifier. DPD of the modulated input signal can compensate for the AM2AM nonlinearity and AM2PM nonlinearity of the power amplifier.

However, recently-developed RF transmitters for IoT applications have more complicated nonlinearity because of their low power design. While the power amplifier has been the single dominant nonlinearity source in older designs, in more recent designs not only the power amplifier but also baseband circuits such as analog Low-Pass Filters (LPFs) and analog mixer voltage-to-current convertors may contribute significant nonlinearity to low power IoT RF transmitters.

Another performance impairment for a wireless RF transmitter is instantaneous gain variation due to dynamic on-off switching of the transmitter. If the transmitter is turned on for the signal transmission, the power consumption of the power amplifier may cause an increase in the temperature of the power amplifier and of the other circuits included with it on the same device. Because the gain of analog devices may be strongly dependent on temperature, this may cause the power amplifier gain and transmitter chain gain to vary over time. In wireless network devices, if this instantaneous gain variation causes an amplitude difference between a period when a training field (for example, a Long Training Field (LTF) of a device operating according to one of the IEEE Std 802.11 family of wireless network standards) is being transmitted and a subsequent period when data is being transmitted, the variation in gain may causes inaccurate scaling of the data constellation and DEVM (Dynamic Error Vector Magnitude) degradation, which may cause an increase in the error rate or a decrease in the attainable bit rate of the transmission.

Accordingly, a need exists for solutions that compensate and correct for the complex nonlinearities and instantaneous gain variations that arise in transmitters, such as transmitters for IoT devices, and especially for low-power physically-compact solutions to these problems.

TECHNICAL FIELD

Embodiments of the present disclosure relate to transmitter circuits, and in particular to RF transmitter circuits including digital and analog components wherein nonlinearity and instantaneous gain variation are compensated for by the digital components.

BRIEF SUMMARY

In an embodiment, a radio frequency (RF) transmitter comprises an RF power amplifier comprising analog circuits and configured to amplify a modulated RF signal, and a Dynamic Error Vector Magnitude (DEVM) correction module comprising digital circuits. The DEVM correction module is configured to compensate for time-dependent variations in an instantaneous gain of the RF power amplifier, and an output of the DEVM correction module is used to generate the modulated RF signal.

In embodiments, the DEVM correction module is configured to receive an input value, determine an index corresponding to an elapsed time after a turning on of the RF power amplifier, determine a gain value according to the index; and produce the output of the DEVM correction module by multiplying the input value by the gain value.

In embodiments, the input value is complex-valued, the output of the DEVM correction module is complex-valued, determining the gain value according to the index includes determining a first gain value according to the index and determining a second gain value according to the index, and producing the output of the DEVM correction module includes producing a real component of the output signal by multiplying a real component of the input signal by the first gain value and producing an imaginary component of the output signal by multiplying an imaginary component of the input signal by the second gain value.

In embodiments, the RF transmitter further comprises a first baseband path comprising analog circuits and configured to process a real component or an imaginary component of a complex-valued signal generated using the output of the DEVM correction module, a mixer circuit configured to produce the modulated RF signal by modulating a carrier signal according to an output of the first baseband path, and a first baseband digital predistortion (DPD) module comprising digital circuits and configured to compensate for amplitude-modulation-to-amplitude-modulation (AM2AM) nonlinearities of the first baseband path.

In an embodiment, a method of operating a Radio-Frequency (RF) transmitter comprising an RF power amplifier comprises determining a duration between a start of a transmission of a packet and a transmission of a symbol included in the packet, determining a gain value according to the duration, the gain value corresponding to an instantaneous variation in the gain of the RF power amplifier, determining a compensated value for the symbol by multiplying a value of the symbol by the gain value, determining a modulated RF signal based on the compensated value, turning on the RF power amplifier at a time corresponding to the start of the transmission of the packet, and transmitting, using the RF power amplifier and based on the modulated RF signal, a signal corresponding to the symbol.

In embodiments, the gain value is determined by selecting a value from a plurality of values in a gain Look-Up Table (LUT).

In embodiments, determining the modulated RF signal based on the compensated value comprises selecting, using the compensated value, a nonlinearity correction factor from a plurality of values in a baseband nonlinearity LUT, the plurality of values in a baseband nonlinearity corresponding to an amplitude-modulation-to-amplitude-modulation (AM2AM) nonlinearity of a baseband circuit of the transmitter, multiplying the compensated value by the baseband circuit nonlinearity correction factor, processing the result of the multiplication using the baseband circuit, and determining the modulated RF signal based on an output of the baseband circuit.

In embodiments, the method further comprises performing a first calibration operation to determine the plurality of values of the baseband nonlinearity LUT, and after performing the first calibration operation, performing a second calibration operation to determine the plurality of values of the gain LUT.

BRIEF DESCRIPTION OF THE DRAWINGS

FIG. 12 illustrates a process for performing calibration of circuits in a transmitter according to an embodiment.

DETAILED DESCRIPTION

A detailed description of embodiments is provided below along with accompanying figures. The scope of this disclosure is limited only by the claims and encompasses numerous alternatives, modifications and equivalents. Although steps of various processes are presented in a particular order, embodiments are not necessarily limited to being performed in the listed order. In some embodiments, certain operations may be performed simultaneously, in an order other than the described order, or not performed at all.

Numerous specific details are set forth in the following description in order to provide a thorough understanding. These details are provided for the purpose of example and embodiments may be practiced according to the claims without some or all of these specific details of the disclosure. For the sake of clarity, technical material that is known in the technical fields related to this disclosure has not been described in detail so that the disclosure is not unnecessarily obscured.

Figure 1:
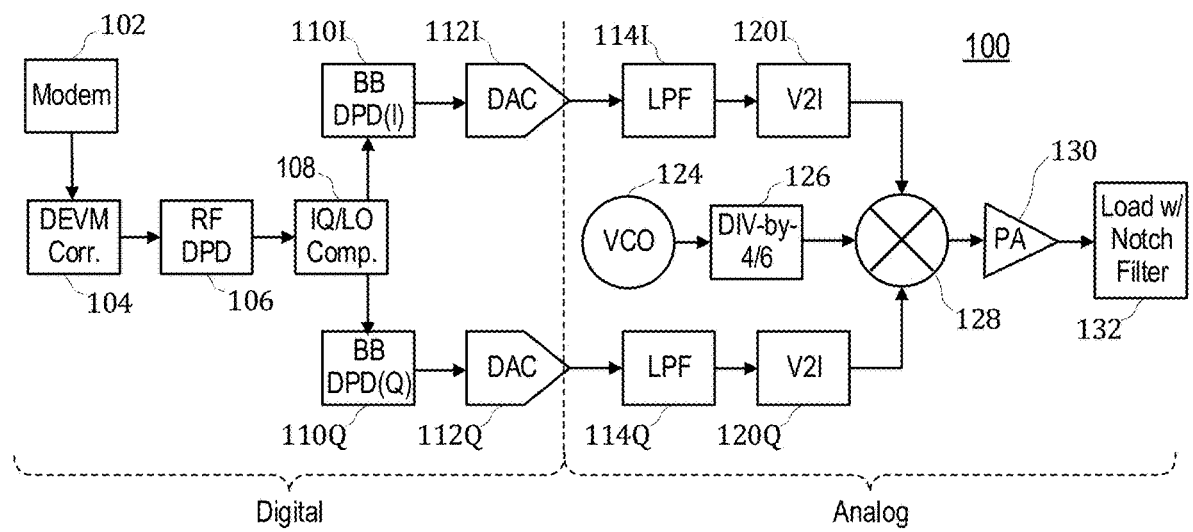
FIG. 1 illustrates a portion of a transmitter according to an embodiment.

FIG. 1 illustrates a portion of a transmitter chain 100 according to an embodiment. The transmitter chain includes a digital portion in which signals are primarily processed as digital signals comprising one or more bits having respective discrete values corresponding to 0 or 1, and an analog portion in which signals are primarily processed as analog signals have continuous values represented as a magnitude of a voltage or current within a continuous range.

The digital portion of the transmitter chain 100 includes a modem module 102, a Radio Frequency section (RF) Digital Pre-Distortion (DPD) module 106, a Dynamic Error Vector Magnitude (DEVM) correction module 104, an IQ mismatch/Local Oscillator leakage (IQ/LO) compensation module 108, an I-path baseband (BB) DPD module 110I, a Q-path BB DPD module 110Q, an I-path Digital-to-Analog Converter (DAC) 112I, and a Q-path Digital-to-Analog Converter (DAC) 112Q. In embodiments, the modules in the digital portion of the transmitter chain may be implemented using purpose-built electronic circuitry, field-programmable logic, processors executing computer programming instructions stored on non-transitory computer readable media, or combinations thereof, but embodiments are not limited thereto.

The analog portion of the transmitter chain 100 includes an I-path Low-Pass Filter (LPF) 114I, a Q-path LPF 114Q, an I-path voltage-to-current (V2I) converter 120I, a Q-path V2I converter 120Q, a Voltage-Controlled Oscillator (VCO) 124, a divider circuit 126, a mixer 128, a power amplifier (PA) 130, and a load circuit 132 that includes a notch filter. In embodiments, the above-listed components of the analog portion of the transmitter chain 100 are each purpose-built electronic circuitry, but embodiments are not limited thereto.

The modem 102 may produce an output signal comprising a sequence of digital values. The digital values may represent complex numbers and accordingly each digital value may include a real value (I) and a complex value (Q) each expressed as a number represented by a plurality of bits. In embodiments, the modem 102 may be a modem designed to produce signals according to a wireless standard. For example, the modem 102 may be a IEEE Std 802.11ah modem.

The DEVM correction module 104 operates to compensate for the variation in the instantaneous gain of the transmitter chain 100 that may occur due to, for example, the transmitter chain 100 experiencing a change in temperature after the transmitter chain 100 begins transmitting. The DEVM correction module 104 produces an output by applying a time-varying gain to a signal received from the modem.

In embodiments, a Crest Factor Reduction (CFR)/Spectrum Shaping Filter (SSF) module (not shown) may process the output of the modem 102 and provide the processed output to the DEVM correction module 104. The processing of the output of the modem 102 by the CFR/SSF module provides proper spectrum shaping and Error Vector Magnitude (EVM), and reduces the Peak-to-Average Power Ratio (PAPR) of the output.

The RF DPD module 106 pre-distorts the output of the DEVM correction module 104 to compensate for non-linearities in the PA 130, and in particular for variations in the gain of the PA 130 that depend on the magnitude of the signal input to the PA 130. The RF DPD module 106 may be configured to compensate for Amplitude-to-Amplitude modulation (AM2AM) nonlinearity, Amplitude-to-Phase modulation (AM2PM) nonlinearity, or both.

The IQ/LO compensation module 108 modifies the output of the RF DPD module 106 to compensate for any mismatch between the analog portion of the real (I) path and the analog portion of the imaginary (Q) path, for DC offset in the mixer 128, for leakage from the local oscillator, or for combinations thereof. This operation may also be referred to as Carrier Suppression/Image Rejection (CS/IR) calibration. The IQ/LO compensation module 108 may receive input signals comprising complex-valued numbers, and may output a real component and an imaginary component each comprising respective real-valued numbers.

The real component of the output of the IQ/LO compensation module 108 is provided to the I-path BB DPD module 110I, and the imaginary component of the output of the IQ/LO compensation module 108 is provided to the Q-path BB DPD module 110Q.

The I-path BB DPD module 110I compensates for nonlinearity caused by I-path baseband blocks such as the I-path LPF 114I, the I-path V2I converter 120I, and the mixer 128. The I-path BB DPD module 110I may compensate for only AM2AM distortion because the signals in the I-path are real-valued (i.e., not complex-valued) signals.

Similarly, the Q-path BB DPD module 110Q compensates for nonlinearity caused by Q-path baseband blocks such as the Q-path LPF 114Q, the Q-path V2I converter 120Q, and the mixer 128. The Q-path BB DPD module 110Q may compensate for only AM2AM distortion because the signals in the Q-path are real-valued (i.e., not complex-valued) signals.

The I-path DAC 112I converts the output of the I-path BB DPD module 110I from multi-bit digital values to corresponding analog values. The Q-path DAC 112Q converts the output of the Q-path BB DPD module 110Q from multi-bit digital values to corresponding analog values. In an illustrative embodiment, the DACs 112I and 112Q have a sampling rate fs of 32 MHz.

The I-path LPF 114I filters the output of the I-path DAC 112I. In an illustrative embodiment, the I-path LPF 114I has a selectable cut-off frequency (for example, the cut-off frequency may be configurable to be any one of a 1.5 MHz, 3 MHz, and 6 MHz) but embodiments are not limited thereto.

Similarly, the Q-path LPF 114Q filters the output of the Q-path DAC 112Q. In an illustrative embodiment, the Q-path LPF 114Q has a selectable cut-off frequency (for example, the cut-off frequency may be configurable to be any one of a 1.5 MHz, 3 MHz, and 6 MHz) but embodiments are not limited thereto.

The I-path V2I converter 120I produces an output current corresponding to an input voltage received from the I-path LPF 114I. The Q-path V2I converter 120Q produces an output current corresponding to an input voltage received from the Q-path LPF 114I.

The respective input voltages of the V2I converters 120I and 120Q may be received as differential signals, wherein the input voltage corresponds to a voltage difference between voltages of a pair of signals. In embodiments, the respective output currents of the V2I converters 120I and 120Q may be produced as differential signals, wherein the output current corresponds to a difference between currents of a pair of signals.

The VCO 124 produces an RF signal having a frequency according to a control voltage provided to the VCO 124. In an illustrative embodiment, the VCO 124 produces a signal having a frequency in the range of 2.56 to 3.84 GHz, according to the control voltage.

The divider circuit 126 produces a carrier signal by performing frequency division on the output of the VCO 124. In an illustrative embodiment, the ratio of the frequency division is selectable. For example, in an illustrative embodiment the divider circuit 126 may divide the output of the VCO 124 by either 4 or 6 according to a control signal provided to the divider circuit 126. Accordingly, in an illustrative embodiment wherein the VCO 124 produces a signal having a frequency in the range of 2.56 to 3.84 GHz, the divider circuit 126 may produce a carrier signal having a frequency of 426 MHZ to 640 MHz when the ratio is set to 6 and having a frequency of 640 MHZ to 960 MHz when the ratio is set to 4.

The mixer 128 combines the outputs of V2I converters 120I and 120Q and the output of the divider circuit 126 to produce a modulated RF signal.

The PA 130 amplifies the modulated RF signal and provides it to the load circuit 132. The load circuit 132 may include, for example, a tunable notch filter configured to filter out second harmonics of the modulated RF signal caused by nonlinearities in the PA 130. The load circuit 132 may further include a load transformer to perform impedance matching, provide isolation, convert the differential output signal of the PA 130 to a single-ended signal, or combinations thereof. The load circuit 132 may produce an output that may be provided to an antenna or another RF transmission medium (such as coaxial cable, stripline, twist pair cable, or the like).

In a digital assisted RF transmitter according to an embodiment includes RF/Analog blocks with their impairments and a digital front end (DFE) that performs RF/Analog impairment calibration and compensation. The RF/Analog impairments and their compensations are as follows:

1) For RF nonlinearity caused by the RF blocks such as the power amplifier, which may include AM2AM and AM2PM distortion, this RF nonlinearity will be compensated by an RF DPD circuit or process. This impairment may also be caused by back-end blocks that perform I (In-phase) and Q (Quadrature-phase) merging, such as an up-conversion mixer.
2) For BB (Base-Band) nonlinearity caused by the baseband blocks such as the mixer voltage-to-current converter or LPF (Low Pass Filter), which only has AM2AM distortion because it is caused by the front-end blocks before the I and Q merging, this impairment is compensated for by BB DPD circuits or processes. A BB DPD circuit or process may be included for each of an I signal path and a Q signal path.

3) For instantaneous gain variation mainly arising in the power amplifier, this impairment is compensated for by a DEVM correction circuit or process, which has a variable instantaneous gain with the same magnitude but opposite polarity (when measured in decibels (dB)) as the instantaneous gain of the power amplifier. The DEVM correction circuit or process may be synchronized with the transmitter enable (e.g., with the turning on of the power amplifier).

4) For compensation of IQ mismatch (or Image Rejection, IR) and/or DC offset (or Carrier Suppression, CS) of the mixer, an IQ/LO compensation circuit or process may be used.

The calibrations on the DFE may be in the order shown in FIG. 1 for DEVM correction, RF DPD, CS/IR calibration, and BB DPD. This order is exactly in the opposite order of RF/Analog impairments such as BB nonlinearity, carrier leakage and IQ mismatch, RF nonlinearity, and instantaneous gain variation of the power amplifier.

Figure 2:
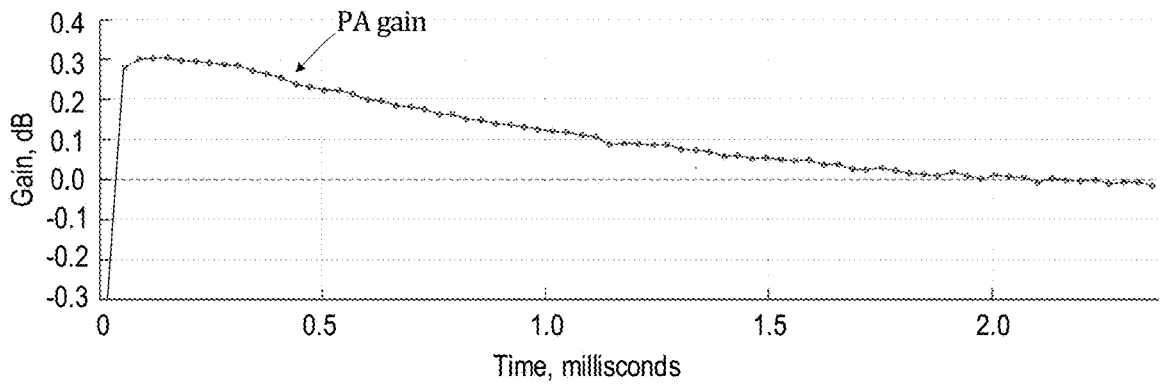
FIG. 2 illustrates time-dependent gain variation of a power amplifier in a transmitter according to an embodiment.

FIG. 2 illustrates time-dependent gain variation of a power amplifier (PA), such as the PA 130 of FIG. 1, in a transmitter according to an embodiment. The graph shows the PA gain on the Y axis (normalized to the nominal steady-state gain of the PA) and time since the PA was powered on is shown on the X axis. The graph shows the PA gain as measured at approximately 30 microsecond intervals.

The PA is operating at a first temperature when it is first turned, and accordingly the gain quickly rises to a relatively high level (+0.3 dB) in the first few tens of microseconds. After that, as the power dissipated by the PA increases the temperature of the PA above the first temperature, the PA gain drops, so that after 2 milliseconds, the PA gain has dropped to a nominal level (here considered to be 0 dB).

Figure 3:
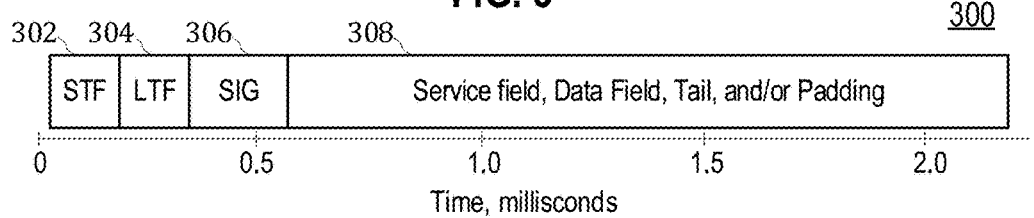
FIG. 3 illustrates a format of a packet transmitted by a transmitter according to an embodiment.

FIG. 3 illustrates a format of a packet 300 transmitted by a transmitter according to an embodiment. Here the packet 300 is in a format having elements typical of packets transmitted by a wireless device operating in an IEEE Std 802.11 wireless network. The packet 300 is shown in the same time scale as used to portray the PA gain in FIG. 2.

The packet 300 includes a Short Training Field (STF) 302, a Long Training Field (LTF) 304, a Signal field (SIG) 306, and payload 308 that, depending on the type of the packet and the standard being complied with, may include a service field, a data field, a tail, padding, or combinations thereof.

The STF 302 may be used by a device receiving the packet 300 for packet detection, automatic gain control (AGC), initial frequency offset estimation, and initial time synchronization. The LTF 304 may be used for channel estimation and for more accurate frequency offset estimation and time synchronization.

If the gain of the PA transmitting the packet 300 is different during the initial period of time when the STF 302 and LTF 304 are being transmitted than it is during the period in which the payload 308 is transmitted, as shown in FIG. 4, then the AGC and the channel estimation determined using the STF 302 and LTF 304 will not be accurate with regard to symbols in the payload 308. As a result, the number of symbols in the payload 308 (hereinafter, payload symbols) that are erroneously decoded may increase, especially when data constellations having a large number of points (such as in symbols modulated using Quadrature Amplitude Modulation with 64 values per symbol (QAM-64)) are used.

Figure 4A:
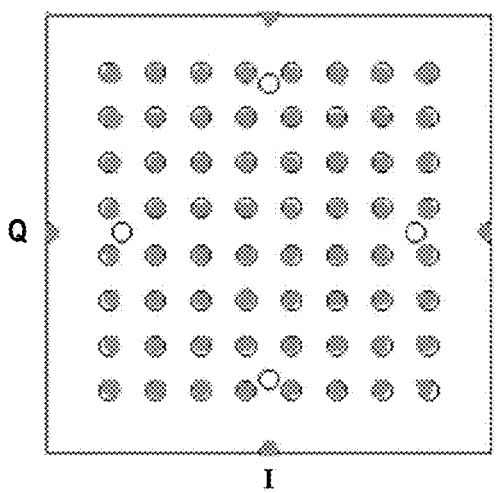
FIG. 4A illustrates Dynamic Error Vector Magnitude (DEVM) degradation.
Figure 4B:
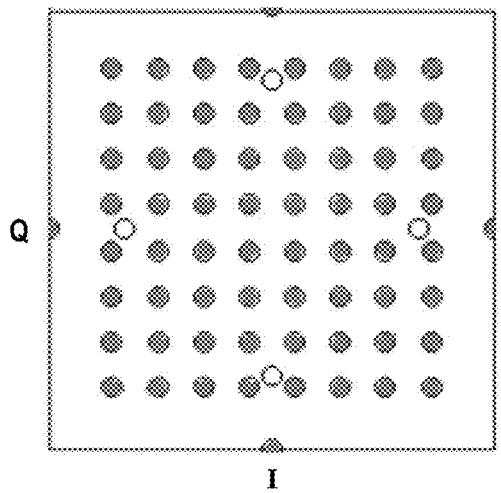
FIG. 4B illustrates reduced DEVM degradation achieved in a transmitter according to an embodiment.

FIGS. 4A and 4B illustrates Dynamic Error Vector Magnitude (DEVM) degradation caused by variation in PA gain during a transmission of the packet 300 of FIG. 3. FIG. 4A shows a plot of received values of payload symbols transmitted in QAM-64 relative to their ideal values when time-dependent PA gain variation is not compensated for, and FIG. 4B shows a plot of values of payloads symbols transmitted in QAM-64 relative to their ideal values when time-dependent PA gain variation is compensated for by a DEVM correction circuit according to an embodiment. In FIGS. 4A and 4B, the X axis represent values of the real (I) component of the symbols, and the Y axis represent value of the imaginary (Q) components.

In particular, FIG. 4A illustrates a case where the PA gain when transmitting the LTF 302 and the STF 304 is 0.3 dB higher than the PA gain when the payload symbols were transmitted, after the received symbols were processed according to the AGC and channel estimation values determined using the STF 302 and LTF 304. FIG. 4B illustrates the same case except that the time-dependent PA gain variation has been compensated for in the transmitter by a DEVM correction circuit or process according to an embodiment.

In FIG. 4A, the values of the received symbols (the gray dots) tend to be closer to the middle of the plot than to the middle of the ideal values indicated by the circles, and in some cases fall outside the circles, especially in values having higher absolute magnitudes. In contrast, the values of the received symbols in FIG. 4B are more centered in the circles, and fall outside the circles less often. Accordingly, errors in interpretation of the values of the received symbols are less common in the case shown in FIG. 4B compared to the case shown in FIG. 4A.

Figure 5:
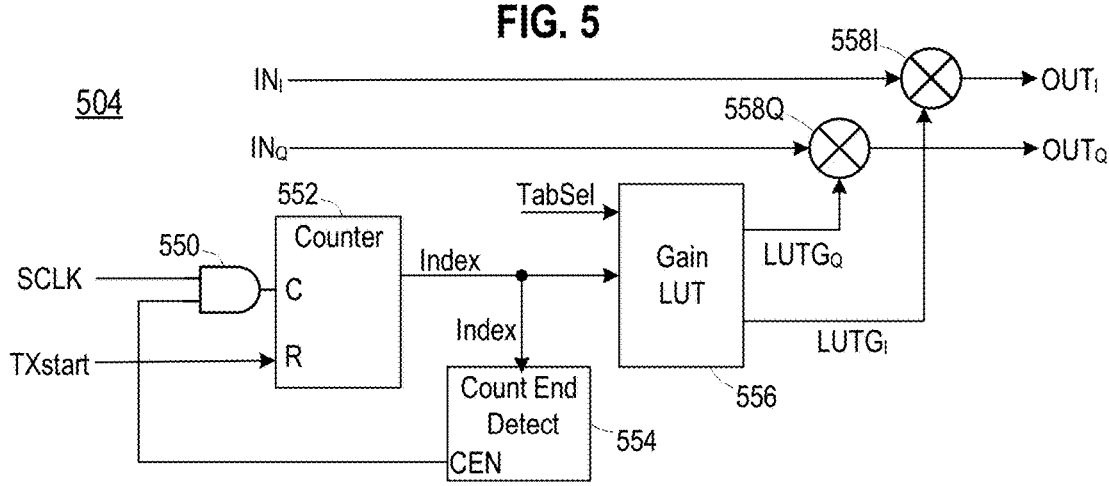
FIG. 5 illustrates a DEVM correction circuit according to an embodiment.

FIG. 5 illustrates a DEVM correction circuit 504 according to an embodiment. The DEVM correction circuit 504 may be included in the DEVM correction module 104 of FIG. 1.

The DEVM correction circuit 504 includes an AND gate 550, a counter 552, a count end detect circuit 554, a gain look-up table (LUT) 556, a first multiplier circuit 558I, and a second multiplier circuit 558Q. The gain LUT 556 may include a plurality of registers, a volatile memory such as a Random Access Memory (RAM), or a non-volatile memory such as a Read-Only Memory (ROM) or flash memory.

The DEVM correction circuit 504 receives an input comprised of an I input $IN_I$ and a Q input $IN_Q$, which may correspond to I and Q components of a complex value. Each of the I input $IN_I$ and the Q input $IN_Q$ may be multi-bit signals expressing values in binary.

In the embodiment shown in FIG. 5, the DEVM correction circuit 504 multiples the values of the I input $IN_I$ and the Q input $IN_Q$ by I and Q gain adjustment values $LUT_I$ and $LUT_Q$ read from the gain LUT 556 to produce the values of an I output $OUT_I$ and a Q output $OUT_Q$, respectively.

In other embodiments, the DEVM correction circuit 504 multiples the values of the I input $IN_I$ and a Q input $IN_Q$ by the same gain adjustment value read from the gain LUT 556 to produce the values of the I output $OUT_I$ and the Q output $OUT_Q$, respectively; that is, in other embodiments, a single value from the gain LUT 556 is used as both the I and Q gain adjustment values $LUT_I$ and $LUT_Q$.

The I and Q gain adjustment values $LUT_I$ and $LUT_Q$ read from the gain LUT 556 are determined according to the multi-bit binary signal Index output by the counter 552. The counter 552 is reset (setting the signal Index to a predetermined constant such as zero) by a transmission start signal TXstart and then incremented at a rate equal to a frequency of a clock signal SCLK when a clock enable output CEN of the count end detect circuit 554 is asserted. The transmission start signal TXstart may be asserted in response to a power amplifier (such as the PA 130 of FIG. 1) being turned on in preparation for performing a transmission. Assertion of the TXstart signal may correspond to a rising or falling edge of the TXstart (when the reset input R of the counter 552 is edge-triggered) or to a positive or negative pulse (when the reset input R of the counter 552 is activated by a high or low level).

The clock enable output CEN of the count end detect circuit 554 is asserted when the counter 552 is reset, and remains asserted until the count end detect circuit 554 detects that the value of the index signal has reached an end-of-count value.

The end of count value may correspond to a time after being turned on at which the temperature (or gain variation corresponding to the temperature) of the turned-on circuit (such as the power amplifier mentioned above) has stabilized. For example, FIG. 2 shows that the gain of a power amplifier may settle at close to a nominal value a little over 2 milliseconds after the power amplifier is turned on. Accordingly, when the clock signal SCLK has a frequency (for example) of 8 KHz and the counter 552 is reset to zero by the transmission start signal TXstart, the end-of-count value may be equal to 2 milliseconds times 8 KHz=16; however, embodiments are not limited thereto.

When the count end detect circuit 554 detects that the value of the index signal has reached an end-of-count value, it de-asserts the clock enable output CEN, which causes the AND gate 550 to stop providing the clock signal SCLK to the counter and thereby causes the signal Index to hold at the end-of-count value.

Accordingly, in embodiments, values of the I and Q gain adjustment values $LUT_I$ and $LUT_Q$ read from the gain LUT 556 are determined by an amount of time that has passed since the most recent turning on of a power amplifier, and accordingly the gain adjustments applied to the values of the I input $IN_I$ and the Q input $IN_Q$ produce the values of the I output $OUT_I$ and the Q output $OUT_Q$ depend on the amount of time that has passed since the most recent turning on of the power amplifier.

In embodiments, a plurality of gain LUTs may be stored in the gain LUT 556, and the gain LUT in use may be selected according to a power output level of the power amplifier, an ambient temperature of the device including the power amplifier, or combinations thereof.

In embodiments, a table selection signal TabSel may be used to select which gain LUT is used to produce the I and Q gain adjustment values $LUT_I$ and $LUT_Q$, and the table selection signal TabSel may have a value determined according to a selected output power, an ambient temperature, or the like, or combinations thereof.

In another embodiment, which gain LUT is used may be determined using the signal Index. For example, a first gain LUT within the gain LUT 556 may correspond to Index values of 0 to 15, a second gain LUT within the gain LUT 556 may correspond to Index values of 16 to 31, and so on. Which gain LUT is used may be determined by selecting the value of the counter 552 when reset and the end-of-count value according to a selected output power, an ambient temperature, an idle time between packets, a current duty cycle of the power amplifier, or the like, or combinations thereof. For example, when the power amplifier is operating at full power, the value of the counter 552 when reset may be 0 (zero) and the end-of-count value may be 15, and when the power amplifier is operating at half power, the value of the counter 552 when reset may be 16 and the end-of-count value may be 31. In another example, the value that the counter 552 is reset to may vary according to an idle time since a previous packet was transmitted, for example, by being greater when the idle time is short, reflecting that the chip temperature may still be elevated because of the previous transmission. The chip temperature still being elevated may cause the power amplifier may be closer to its steady-state gain when turned on and may settle to its steady-state gain in less time.

In embodiments, the frequency of the clock signal SCLK may be lower than a rate at which new values of the I input $IN_I$ and the Q input $IN_Q$ are provided to the DEVM correction circuit 504; for example, the clock signal SCLK may have a period of 128 microseconds, and new values of the I input $IN_I$ and the Q input $IN_Q$ may be provided every 4 or 16 microseconds, where 4 or 16 microseconds is a symbol duration of a symbol being transmitted. In such embodiments, an I gain adjustment value $LUT_I$ corresponding to a single value of the signal Index may be used to produce a plurality of sequential values of the I output $OUT_I$ from respective values of the I input $IN_I$, and a Q gain adjustment value $LUT_Q$ corresponding to that value of the signal Index may be used to produce a plurality of sequential values of the Q output $OUT_Q$ from respective values of the Q input $IN_Q$. For example, when the clock signal SCLK has a period of 128 microseconds and the symbol duration is 4 microseconds, each value of I and Q gain adjustment values $LUT_I$ and $LUT_Q$ read from the gain LUT 556 may be used to process I and Q values corresponding to 32 symbols.

In another embodiment, the period of the clock signal SCLK may correspond to the period of a symbol transmitted by the transmitter. For example, when the symbols transmitted by the transmitter include both symbols having periods of 4 microseconds and symbols having periods of 16 microseconds, in one embodiment the clock signal SCLK may have a period of 4 microseconds, and in another embodiment the clock signal SCLK may have a period of 16 microseconds.

Figure 6:
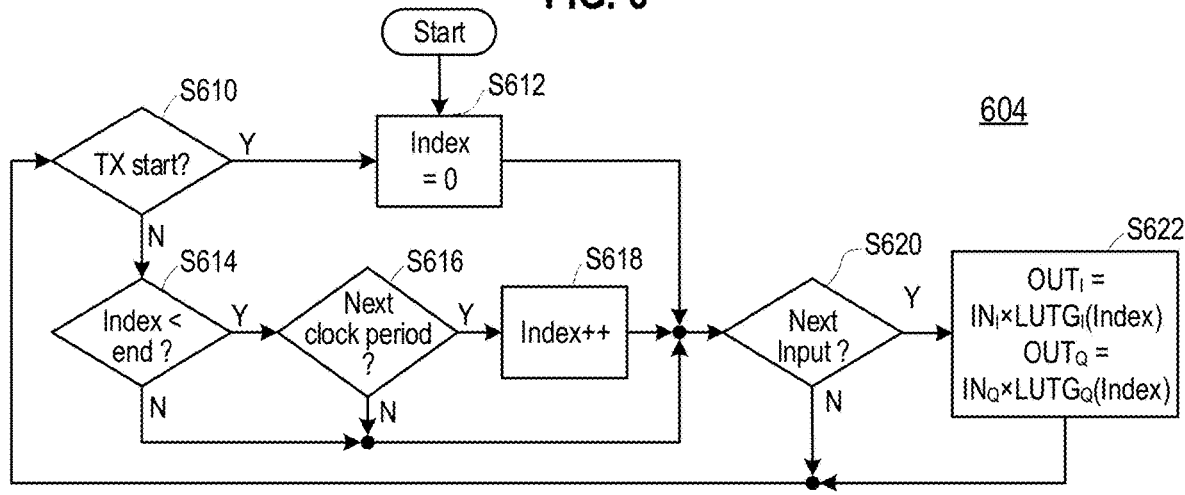
FIG. 6 illustrates a process for performing DEVM correction according to an embodiment.

FIG. 6 illustrates a process 604 for performing DEVM correction according to an embodiment. The process 604 may be performed by a circuit such as the DEVM correction circuit 504 of FIG. 5, or may be performed by a processor performing programming instructions stored on a non-transitory computer-readable media.

At step S610, the process 604 determines whether a transmission (TX) is starting, that is, whether a power amplifier is being turned on. When the transmission is starting, the process 604 proceeds to step S612. When the transmission is already in progress or is not in progress, the process 604 proceeds to step S614.

At step S612, the process 604 sets an Index to 0. The process 604 then proceeds to step S620.

At step S614, the process 604 determines whether the Index is less than an end-of-count value (end). When the Index is less than the end-of-count value, then the process 604 is operating during a period of time at the start of the transmission wherein the instantaneous gain of the power amplifier may be changing, and accordingly the process 604 proceeds to step S616. Otherwise the process 604 proceeds to step S620.

At step S616, the process 604 determines whether it is time to increment the Index because the process 604 has entered a next clock period. That is, the process 604 determines whether the time elapsed since the Index was most recently incremented or reset is equal to or greater than a period of a clock signal, such as the clock SCLK of FIG. 5.

When the process 604 has entered a next clock period, the process 604 proceeds to step S618; otherwise, the process 604 proceeds to step S620.

At step S618, the process 604 increments the value of the Index. The process 604 then proceeds to step S620.

At step S620, the process 604 determines whether a new input value has been provided for processing. In an embodiment, process 604 may determine that a new input value has been provided for processing in each cycle of symbol-rate clock having a period equal to a duration of a symbol being transmitted. When the process 604 determines that a new input value has been provided, the process 604 proceeds to step S622; otherwise the process 604 proceeds to step S610.

At step S622, the process reads an Index$^{th}$ LUT I value LUTG$_I$[Index] and an Index$^{th}$ LUT Q value LUTG$_Q$[Index] from an LUT, produces a new value of a I output OUT$_I$ by multiplying the Index$^{th}$ LUT I value LUTG$_I$[Index] by the I component IN$_I$ of the new input value, and produces a new value of a Q output OUT$_Q$ by multiplying the Index$^{th}$ LUT Q value LUTG$_Q$[Index] by the I component IN$_I$ of the new input value.

In an embodiment, the process 604 may read a single Index$^{th}$ LUT value LUTG[Index] and use it as both the Index$^{th}$ LUT I value LUTG$_I$[Index] and the Index$^{th}$ LUT Q value LUTG$_Q$[Index].

The process 604 then proceeds from step S622 to step S610.

Similarly to the embodiment of FIG. 5, the process 604 may operate using a selected one of a plurality of gain LUTs stored in the device including the transmitter, the selected gain LUT being selected according to an operational parameter (such as a selected power output, an idle time between packets, or a current duty cycle), an environmental parameter (such as a current ambient temperature), or a combination thereof corresponding to the device.

In embodiments, the process 604 or the DEVM correction circuit 504 may operate in accordance with:

$$OUT_I = \begin{cases} IN_I \times LUTG_I[\text{Index}], & 0 \leq \text{Index} \leq T_S/P, \text{ and} \\ IN_I \times LUTG_I[T_S/P]. & \text{Index} > T_S/P \end{cases} \quad \text{Equation 1}$$

$$OUT_Q = \begin{cases} IN_Q \times LUTG_Q[\text{Index}], & 0 \leq \text{Index} \leq T_S/P, \text{ and} \\ IN_Q \times LUTG_Q[T_S/P]. & \text{Index} > T_S/P \end{cases} \quad \text{Equation 2}$$

wherein IN$_I$ is a real component of a complex input value, IN$_Q$ is an imaginary component of the complex input value, Index is a natural number corresponding to an elapsed time since a power amplifier was turned on, T$_S$ is a time since the power amplifier was turned on when an instantaneous gain of the power amplifier is considered to have settled to a nominal value, P is a period of time corresponding to an interval between consecutive values of Index, LUTG$_I$[Index] is an I-path gain LUT entry corresponding to the value of Index, LUTG$_Q$[Index] is a Q-path gain LUT entry corresponding to the value of Index, OUT$_I$ is a real component of a complex output value, and OUT$_Q$ is an imaginary component of the complex output value.

Figure 7:
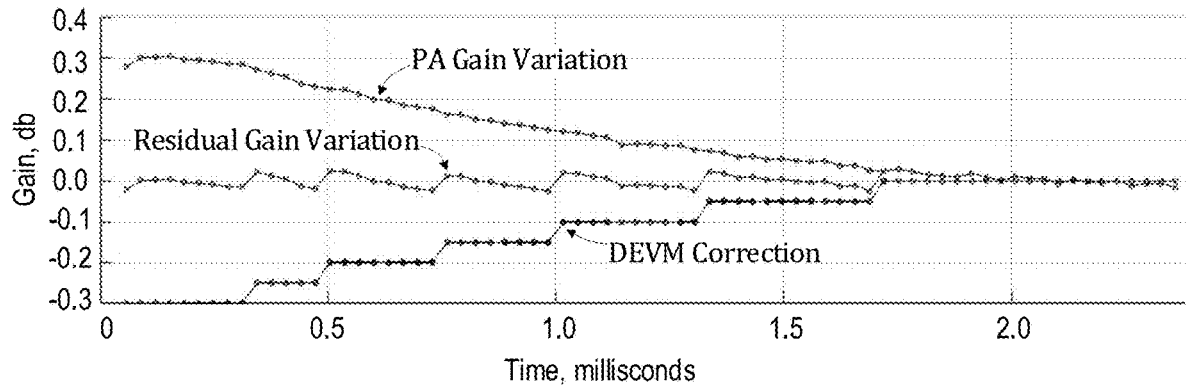
FIG. 7 illustrates correction of time-dependent gain variation of a power amplifier in a transmitter according to an embodiment.

FIG. 7 illustrates correction of time-dependent gain variation of a power amplifier (PA) in a transmitter according to an embodiment. In the example of FIG. 17, 16 time-segments are used for the DEVM correction. corresponding to 16 entries (or 16 pairs of I and Q entries) in a gain LUT. However, embodiments are not limited thereto.

In this example, the length of each time-segment is variable with a maximum of 128 usec. The top line is the measured gain variation of the power amplifier and the middle line shows the residual error gain variation after the calibration. In this example the resolution of the DEVM correction gain is 0.05 dB.

As shown in the figure, the residual gain variation after correction by an embodiment is less than 0.05 dB, showing that instantaneous gain variation of the power amplifier is compensated for well.

Embodiments of the present disclosure can correct the dynamic EVM degradation caused by time-dependent instantaneous gain variation in a power amplifier by adjusting, in the digital circuits of the transmitter, the instantaneous amplitude of the input signal provided to the analog blocks in a manner opposite to the instantaneous gain variation. Embodiments are superior to dynamic EVM correction scheme of the related arts (such as, for example, pre-heating the power amplifier) because they do not incur additional power consumption and are performed digitally, and are therefore not affected by process, voltage, and temperature (PVT) variations.

Moreover, the DEVM correction circuits and processes according to embodiments compensate for the analog gain variation itself, and can therefore rely on calibration results that are independent of the wireless standard (or portion thereof) according to which the transmitter employing the embodiment is operating under at any particular time. For example, IEEE Std 802.11ah CBW1 (1 MHz Channel Bandwidth) packets have different STF and LTF timing than IEEE Std 802.11ah CBW2 (2 MHz Channel Bandwidth) and CBW4 (4 MHz Channel Bandwidth) packets, but even though the 802.11ah 1 MHz and 2 MHz/4 MHz transmissions have different STF and LTF lengths and timing, a dynamic EVM correction circuit or process according to an embodiment can properly compensate for the power amplifier instantaneous gain variations for both cases, based on a same set of gain LUT entries.

Figure 8A:
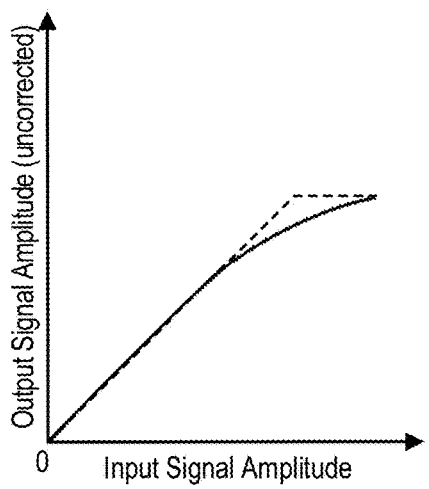
FIG. 8A illustrates Amplitude-to-Amplitude (AM2AM) nonlinearity of baseband circuits of a transmitter according to an embodiment.

FIG. 8A illustrates Amplitude-to-Amplitude (AM2AM) nonlinearity of baseband circuits of a transmitter according to an embodiment. The baseband circuits correspond to analog circuits that separately process one of the I and Q signals before the I and Q signals are used to modulate the carrier frequency of the RF transmission. In one case, the baseband circuits may include the I path LPF 114I of FIG. 1, the I path V2I circuit 120I of FIG. 1, or both. In another case, the baseband circuits may include the Q path LPF 114Q of FIG. 1, the Q path V2I circuit 120Q of FIG. 1, or both.

The dashed line in FIG. 8A represents the ideal amplitude-in-to-amplitude-out response of a baseband circuit. The solid line of FIG. 8A represents the actual amplitude-in-to-amplitude-out response of a baseband circuit. The deviation of the solid line from the dashed line corresponds to AM2AM nonlinearity.

Figure 8B:
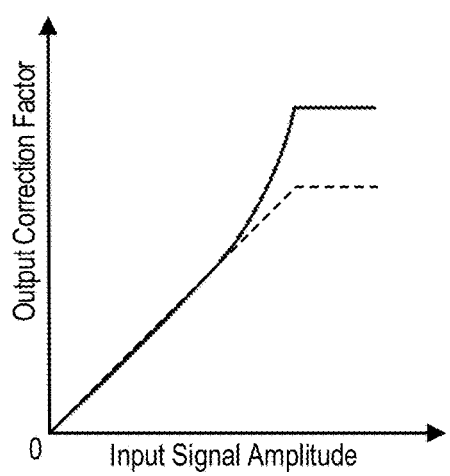
FIG. 8B illustrates output correction factors corresponding to the AM2AM nonlinearity of the baseband circuits shown in FIG. 8A.

FIG. 8B illustrates output correction factors corresponding to the AM2AM nonlinearity of the baseband circuit shown in FIG. 8A. By using measurements of the baseband circuits taken during a calibration procedure, a baseband nonlinearity model and transfer function can be determined by curve fitting. The output correction factors correspond to the inverse of the transfer function.

Figure 8C:
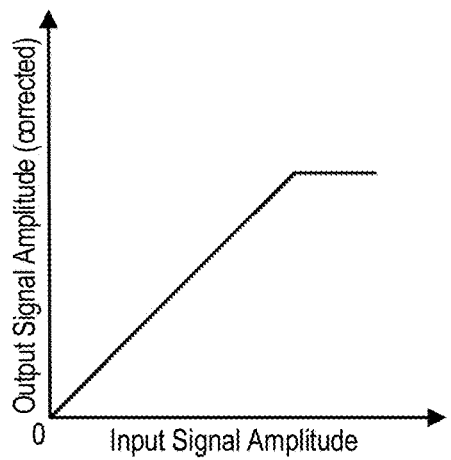
FIG. 8C illustrates corrected AM2AM nonlinearity of the baseband circuits according to an embodiment.

FIG. 8C illustrates correction of the AM2AM nonlinearity of the baseband circuits according to an embodiment. The correction of the AM2AM nonlinearity may be performed by multiplying a value of an input to the baseband circuits by a value selected from the output correction factors according to the value of the input and providing the result of the multiplication to the baseband circuit as a substitute for the value of the input.

Because the I and Q paths each have their own baseband circuits that may be physically separated, the respective basebands circuits of the I and Q paths may have different nonlinearity. In this case, the I and Q basebands circuits may be calibrated separately, producing different output correction factors. Accordingly, separate respective LUTs storing the respective output correction factors may be used for the I and Q paths.

Figure 9:
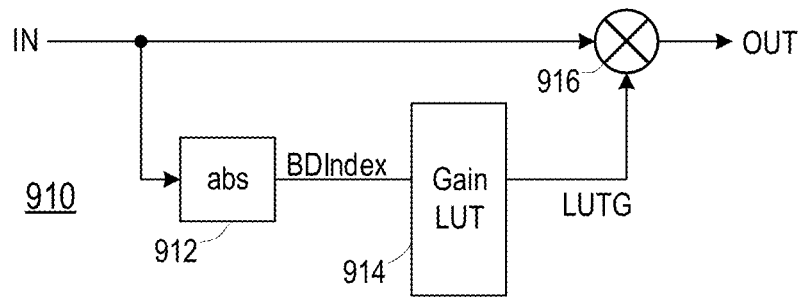
FIG. 9 illustrates a baseband digital pre-distortion (DPD) circuit for correcting AM2AM nonlinearity of baseband circuits in a transmitter according to an embodiment.

FIG. 9 illustrates a baseband digital pre-distortion (DPD) circuit 910 for correcting AM2AM nonlinearity of baseband circuits in a transmitter according to an embodiment. The baseband DPD circuit 910 may be used to implement in the I-path baseband DPD module 110I, of FIG. 1, the Q-path baseband DPD module 110Q of FIG. 1, or both.

The baseband DPD circuit 910 includes an absolute value circuit 912, a gain Look-Up Table (LUT) 914, and a multiplier circuit 916. In embodiments, the absolute value circuit 912, the gain LUT 914, and the multiplier circuit 916 are each digital circuits.

The absolute value circuit 912 accepts an input signal IN and produces an index signal BDIndex corresponding to the absolute value of a value of the input signal IN. The index signal BDIndex is provide as an address to the gain LUT 914 to select a LUT gain value LUTG from the gain LUT 914. The value of the input signal IN is then multiplied by the LUT gain value LUTG to produce a value of the output signal OUT.

In embodiments wherein the values of the input signal IN are always positive or wherein the gain LUT 914 may use both positive and negative values to select the LUT gain value LUTG, the absolute value circuit 912 may be omitted and the value of the input signal IN used as the index signal BDIndex to the gain LUT 914.

In embodiments, the gain LUT 914 may comprise a plurality of registers, a volatile memory such as a static random access memory (SRAM) or Dynamic RAM (DRAM), or a non-volatile memory such as a Read-Only Memory (ROM), an Electrically-Erasable ROM (EEROM), or a flash memory. Values stored in the gain LUT 914 may be determined by a calibration process that determines the AM2AM nonlinearity of the baseband signal path that the baseband DPD circuit 910 is included in.

In embodiments, the index signal BDIndex may have fewer bits than the values of the input signal. For example, in an embodiment wherein the input signal IN has N bits of significance, the index signal BDIndex may be determined according to only the M most significant bits of the input signal IN, where M is greater than one and less than N. In an illustrative embodiment, M may be 6.

Figure 10:
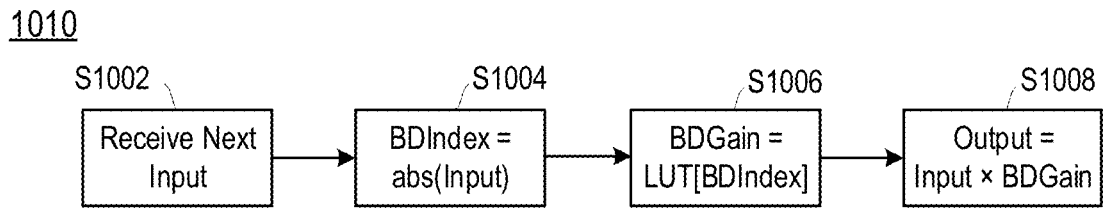
FIG. 10 illustrates a process for performing baseband DPD according to an embodiment.

FIG. 10 illustrates a process 1010 for performing baseband DPD according to an embodiment. The process 604 may be performed by a circuit such as the baseband DPD circuit 910 of FIG. 9, or may be performed by a processor performing programming instructions stored on a non-transitory computer-readable media.

At step S1002, the process 1010 receives the next value of the input.

At step S1004, the process 1012 determines a baseband DPD index BDIndex based on an absolute value of the received value of the input. In embodiments, the index BDIndex may be determined directly from the received value of the input without taking the absolute value. In embodiments, the index BDIndex is determined based on less than all the bits that makeup the input; for example, the index BDIndex may be determined using only the M most significant bits of an input having N bits, where M and N are positive integers and 1<M<N.

At step S1006, the index BDIndex is used to select a baseband DPD gain value BDGain from a look-up table (LUT). When the process 1010 is used to compensate for nonlinearity of analog circuits of an I-path of a transmitter, the values in the LUT may be specific to analog circuits of the I-path, and when the process 1010 is used to compensate for nonlinearity of analog circuits of a Q-path of a transmitter, the values in the LUT may be specific to analog circuits of the Q-path.

At step S1008, the received value of the input is multiplied by the selected baseband DPD gain value BDGain to produce a value of the output.

Figure 11:
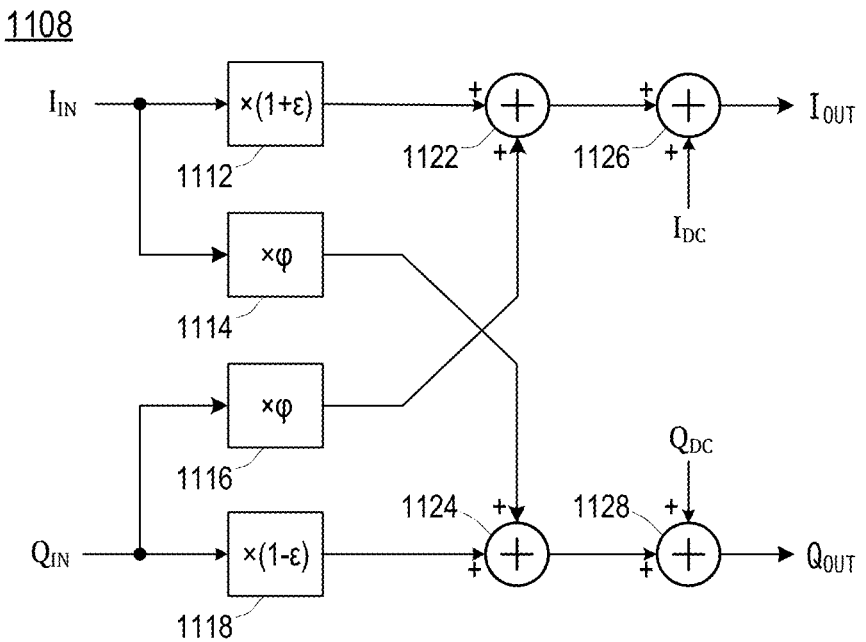
FIG. 11 illustrates a circuit for performing I-Q mismatch/ local oscillator leakage (IQ/LO) compensation in a transmitter according to an embodiment.

FIG. 11 illustrates a IQ/LO compensation circuit 1108 for performing I-Q mismatch/local oscillator leakage (IQ/LO) compensation in a transmitter according to an embodiment. The circuit 1108 may be included in the IQ/LO compensation module 108 of FIG. 1.

The IQ/LO compensation circuit 1108 processes a complex-valued input signal comprised of a real input signal $I_{IN}$ and an imaginary input signal $Q_{IN}$ using an amplitude mismatch value $\varepsilon$, a phase mismatch value $\varphi$, a real DC offset value $I_{DC}$, and an imaginary DC offset value $Q_{DC}$.

The amplitude mismatch value $\varepsilon$ is determined (for example, by a calibration operation) according to a difference in gain between analog circuits of an I path of a transmitter and analog circuits of an Q path of the transmitter. The phase mismatch value $\varphi$ is determined (for example, by a calibration operation) according to a difference in the phase response between the analog circuits of an I path of the transmitter and the analog circuits of an Q path of the transmitter.

The real DC offset value $I_{DC}$ and the imaginary DC offset value $Q_{DC}$ are selected to compensate for local oscillator leakage generated in the RF blocks of the I and Q paths.

The IQ/LO compensation circuit 1108 includes first, second, third, and fourth multiplier circuits 1112, 1114, 1116, and 1118, and first, second, third, and fourth adder circuits 1122, 1124, 1126, and 1128. All of the circuits in the IQ/LO compensation circuit 1108 are digital circuits.

The first multiplier circuit 1112 multiplies values of the real input $I_{IN}$ by one plus the amplitude mismatch value $\varepsilon$. The second multiplier circuit 1114 multiplies values of the real input $I_{IN}$ by the phase mismatch value $\varphi$.

The fourth multiplier circuit 1118 multiplies values of the imaginary input $Q_{IN}$ by one minus the amplitude mismatch value $\varepsilon$. The third multiplier circuit 1116 multiplies values of the imaginary input $Q_{IN}$ by the phase mismatch value $\varphi$.

The first and third adder circuits 1122 and 1126 sum the output of the first multiplier circuit 1112, the output of the third multiplier circuit 1116, and the real DC offset value $I_{DC}$ to produce values of the real output $I_{OUT}$. The second and fourth adder circuits 1124 and 1128 sum the output of the second multiplier circuit 1114, the output of the fourth multiplier circuit 1118, and the imaginary DC offset value $Q_{DC}$ to produce values of the imaginary output $Q_{OUT}$.

FIG. 12 illustrates a process 1200 for performing calibration of circuits in a transmitter according to an embodiment. In embodiments, all or part of the process 1200 may be performed as part of a process of manufacturing a device including the transmitter according to an embodiment. In other embodiments, a part of the process 1200 may be performed on a sample device including an embodiment and the resulting calibration results used to calibrate the pertinent modules of a plurality of like devices.

When the transmitter according to an embodiment is implemented using a plurality of the semiconductor devices included on a module, the process 1200 may be performed on a module level. The process 1200 id described with reference to the transmitter 100 of FIG. 1.

At step 1202, the process 1200 performed IQ mismatch and DC offset calibration for the transmitter to determine the parameters (e.g., $\varepsilon$, $\varphi$, $I_{DC}$, and $Q_{DC}$) to be used in the IQ/LO compensation module 108 of FIG. 1. The IQ mismatch and DC offset may strongly depend on the chain gain, in which case the step S1202 may be run for a plurality of different gain settings. Techniques for implementing step S1202 are known in the related arts, and accordingly are omitted in the interest of brevity.

Once the parameters for IQ mismatch and DC offset are determined, they are programmed and/or loaded into the IQ/LO compensation module 108 for use during the remaining calibration processes of the process 1200.

At step S1204, the process 1204 determines whether the remaining calibrations will be performed using a loopback circuit. When the loopback circuit is used, a receiver circuit of the device will be used to measure the output of the transmitter, and to obtain accurate results, that receiver circuit may be calibrated to eliminate certain impairments of the receiver circuit. If a loopback circuit is not used (such as if the transmitter output will be measured by external test equipment) the receiver circuit does not need to be calibrated.

Accordingly, if the loopback circuit is to be used in the remaining calibrations of the process 1200, at step S1204 the process 1200 proceeds to step S1206; otherwise, the process 1200 proceeds to step S1208.

At step S1206, the process 1200 performed IQ mismatch and DC offset calibration for the receiver circuit and applies the results to the receiver circuit. Techniques for implementing step S1206 are known in the related arts, and accordingly are omitted in the interest of brevity.

In some embodiments, a loopback circuit will always be used for the remaining calibrations, and accordingly step S1204 may be omitted, and the process 1200 proceeds directly to step S1206 after step S1202. In other embodiments, a loopback circuit will never be used for the remaining calibrations, and accordingly steps S1204 and S1206 may be omitted, and the process 1200 proceeds directly to step S1208 after step S1202.

At step S1208, the gain of the mixer 128 is reduced to eliminate (or at least substantially reduce) RF nonlinearity caused by the mixer and the circuits following it in the transmitter chain during the baseband (BB) DPD calibration that follows step S1208. Reducing the gain is done because the RF DPD module 106 has not been calibrated yet, and decreasing the gain of the mixer 128 reduces the nonlinearity in the gain of the power amplifier 130.

At step S1210, the process 1200 causes an I-only signal to be transmitted by the transmitter 100 so that the baseband I path nonlinearity can be determined. For the baseband I path, the real signal is required but the imaginary signal is not. To generate the real signal with variable amplitude, the baseband Q path is turned off and the transmitter transmits only the I signal of a non-constant-envelope modulated signal provided at or upstream of the IQ/LO compensation module 108. The non-constant-envelope modulated signal may be, for example, an Orthogonal Frequency Division Multiplexing (OFDM) modulated signal.

At step S1212, the process 1200 captures the transmitter output and determines the AM2AM nonlinearity of the baseband I path by comparing the amplitude of the non-constant envelop modulated signal to the amplitude of the corresponding output signal produced by the transmitter. In embodiments, the output signal produced by the transmitter may be captured using a loopback circuit; in other embodiments it may be captured using a signal capture instrument. The non-constant envelop modulated signal may be determined using a signal dump from the digital hardware or from digital circuit simulation.

Because the maximum amplitude of the signal provided to the power amplifier 130 is kept low by the mixer gain backoff performed in step S1208, the power amplifier 130 does not contribute significant non-linearity to the output of the transmitter 100 during step S1212.

At step S1214, the process 1200 uses the AM2AM nonlinearity of the baseband I-path analog circuits determined in step S1212 to determine compensating values for the baseband I path gain LUT.

In some cases, the baseband Q path is sufficiently similar to the baseband I path and is subject to sufficiently similar operating conditions so that the calibration for the baseband I path may be used for the baseband Q path as well. In such cases, at step S1216 the process 1200 proceeds to step S1218. Otherwise, when the baseband Q path is to be independently calibrated, the step S1216 the process 1200 proceeds to step S1220.

At step S1218, since the calibration of the baseband I path is to be used as the calibration for the baseband Q path, the compensating values for the baseband Q path gain LUT are set to be copies of the compensating values for the baseband I path gain LUT.

At step S1220, the process 1200 causes a Q-only signal to be transmitted by the transmitter 100 so that the baseband Q path nonlinearity can be determined. For the baseband Q path, the imaginary signal is required but the real signal is not. To generate the imaginary signal with variable amplitude, the baseband I path is turned off and the transmitter transmits only the Q signal of a non-constant envelop modulated signal provided at or upstream of the IQ/LO compensation module 108.

At step S1222, the process 1200 captures the transmitter output and determines the AM2AM nonlinearity of the baseband Q path by comparing the amplitude of the non-constant envelop modulated signal to the amplitude of the corresponding output signal produced by the transmitter, as described with respect to the baseband I path in step S1212, above.

At step S1224, the process 1200 uses the AM2AM nonlinearity of the baseband Q-path analog circuits determined in step S1222 to determine compensating values for the baseband Q path gain LUT.

At step S1226, the process 1200 loads the determined compensating values for the baseband I path gain LUT into the gain LUT of the I-path baseband DPD module 110I, and loads the determined compensating values for the baseband Q path gain LUT into the gain LUT of the I-path baseband DPD module 110Q.

At step S1230, the gain of the mixer 128 is set to maximum so that that nonlinearities of the PA 130 may be measured.

At step S1232, the process 1200 causes the transmitter to transmit a complex-valued signal (that is, a signal including both I (real) and Q (imaginary) components) so that AM2AM and AM2PM nonlinearity of the PA 130 may be determined. The complex-valued signal has a variable amplitude.

At step S1234, the process 1200 captures the transmitter output and complex-valued signal used to generate the transmitter output.

At step S1236, the process 1200 determines compensation values for the RF DPD module 106 by comparing the amplitudes and phases of the captured transmitter output to the corresponding values of complex-valued signal.

At step S1238, the process 1200 updates the RF DPD module 106 with the values determined in step S1236. At this point in the process 1200, the IQ/LO nonlinearity of the mixer 128, the baseband I path nonlinearity, the baseband Q path nonlinearity, and the non-time-dependent AM2AM and AM2PM nonlinearity of the PA 130 are all being compensated for and linearized by the components for the transmitter 100.

At step S1240, the process 1200 causes the transmitter to transmit a DEVM compensation training signal. In an embodiment, the DEVM compensation training signal is as single tone signal having a non-varying amplitude that is transmitted immediately after the PA 130 has been turned on. In embodiments, the DEVM compensation training signal is based on an input signal having only real (as opposed to complex or imaginary) values. In an embodiment, the input signal is provided at or before the RF DPD module 104.

At step S1242, the process 1200 captures the transmitter output with a defined time and signal amplitude resolution. The signal capture is synchronized with the PA 130 being turned on. For example, the process 1200 may capture the output of the PA 130 at intervals of 128 microseconds for the two milliseconds following the PA 130 being turned on, and the captured data may have an amplitude resolution of 0.01 decibels.

The process 1200 may also capture the input to the PA 130, or may use a simulation result or mathematical model to generate an approximation of the input to the PA 130.

At step S1244, the process 1200 determines instantaneous gain correction values for the LUT of the DEVM correction module 104 by determining a ratio between each captured output of the PA 130 from step S1242 to each corresponding input (captured or modelled) to the PA 130. In an embodiment, the ratio may be scaled by a normalizing factor so that the ideal ratio when the PA 130 has reached a steady state is 1.

The instantaneous gain correction values for each captured output corresponds to the multiplicative inverse of the determined ratio. For example, if the captured output of the PA 130 at 128 microseconds after the PA 130 was turned on is 1.11 times the captured or modeled input (after normalization), the instantaneous gain correction value would be 0.9. For another example, if the ratio of the output of the PA 130 to its input at 128 microseconds is +0.3 decibels (dB), the inverse of the determined ratio would be −0.3 dB.

At step S1246, the LUT of the DEVM correction module 104 is updated with the instantaneous gain correction values determined at step S1244. For example, referring to the DEVM correction module 504 of FIG. 5, if the instantaneous gain correction value for 128, 256, and 384 microseconds after the PA 130 has been turned on are −0.30, −0.30, and −0.25 dB, respectively, and the period of the clock SCLK is 128 microseconds, then the entries in the gain LUT 556 corresponding to Index values of 1, 2 and 3 would respectively correspond to −0.30, −0.30, and −0.25 dB.

Once step S1246 is completed, the transmitter 100 is configured to compensate to all of its RF and Analog impairments, and accordingly the transmitter 100 is ready to be used. To reduce or eliminate the need to repeat the process 1200, compensation value determined by the process 1200 may be stored in the pertinent circuits of the transmitter 100, or may be stored in a non-volatile memory of a device including the transmitter 100 and loaded into the transmitter 100 as part of the initialization of that device. The values may be stored in, for example, flash memory, Electrically Erasable Programmable Read-Only Memory (EEPROM), fuse-programmable ROM, or the like.

Embodiments improve the performance of a transmitter by compensating for various analog impairments such as complex RF and BB nonlinearity and instantaneous gain variation. Embodiments provide this improvement without substantially increasing the size of the transmitter, with low power consumption, and with high immunity to PVT variations because the compensation blocks are compact blocks realized in the digital domain.

Embodiments of the present disclosure include electronic devices, e.g., one or more packaged semiconductor devices, configured to perform one or more of the operations described herein. Embodiments of the present disclosure may be implemented in a single semiconductor die. However, embodiments are not limited thereto.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined. The order of operations described in embodiments is illustrative and may be re-ordered unless otherwise constrained. Further, features of two or more embodiments may be combined to form a new embodiment.

What is claimed is:

1. A radio frequency (RF) transmitter, comprising:
an RF power amplifier comprising analog circuits and configured to amplify a modulated RF signal generated by modulation of a carrier signal; and
a Dynamic Error Vector Magnitude (DEVM) correction module comprising digital circuits, the DEVM correction module configured to compensate for time-dependent variations in an instantaneous gain of the RF power amplifier,
wherein an output of the DEVM correction module is a digital signal,
wherein the modulation of the carrier signal used to generate the modulated RF signal is performed according to the output of the DEVM correction module, and
wherein the DEVM correction module comprises:
a counter circuit configured to set an index to an initial count value in response to the power amplifier being turned on, increment the index at a predetermined rate when enabled, and not increment the index when disabled;
a count end detect circuit configured to enable the counter circuit when a value of the index is less that an end-of-count value and to disable the counter circuit when a value of the index is greater than the end-of-count value;
a gain look-up table (LUT) configured to produce a gain value according to the index; and
a multiplier circuit configured to produce the output of the DEVM correction module by multiplying an input signal received by the DEVM correction module by the gain value.

2. The RF transmitter of claim 1, wherein the DEVM correction module is configured to:

receive an input value;
determine the index corresponding to an elapsed time after the turning on of the RF power amplifier;
determine the gain value according to the index; and
produce the output of the DEVM correction module by multiplying the input value by the gain value.

3. The RF transmitter of claim 1,
wherein the input signal is complex-valued,
wherein the output of the DEVM correction module is complex-valued,
wherein producing the gain value according to the index includes determining a first gain value according to the index and determining a second gain value according to the index, and
wherein producing the output of the DEVM correction module includes:
producing a real component of the output signal by multiplying a real component of the input signal by the first gain value; and
producing an imaginary component of the output signal by multiplying an imaginary component of the input signal by the second gain value.

4. The RF transmitter of claim 1,
wherein the input signal is complex-valued and the output of the DEVM correction module is complexed value,
wherein the gain value includes a first gain component and a second gain component, and
wherein the multiplier circuit comprises:
a first multiplier configured to produce a real component of the output of the DEVM correction module by multiplying a real component of the input signal by the first gain component, and
a second multiplier configured to produce an imaginary component of the output of the DEVM correction module by multiplying an imaginary component of the input signal by the second gain component.

5. The RF transmitter of claim 1, wherein the initial count value, the end-of-count value, or both are determined according to one or more operational parameters, one or more environmental parameters, or a combination thereof.

6. The RF transmitter of claim 1, wherein the DEVM correction module comprises a plurality of LUTs, and the gain LUT is selected according to one or more operational parameters, one or more environmental parameters, or a combination thereof from among the plurality of LUTs.

7. The RF transmitter of claim 1, wherein values in the gain LUT are determined according to a calibration process.

8. A radio frequency (RF) transmitter, comprising:
an RF power amplifier comprising analog circuits and configured to amplify a modulated RF signal generated by modulation of a carrier signal;
a Dynamic Error Vector Magnitude (DEVM) correction module comprising digital circuits, the DEVM correction module configured to compensate for time-dependent variations in an instantaneous gain of the RF power amplifier;
a first baseband path comprising analog circuits and configured to process a real component of a complex-valued signal generated using an output of the DEVM correction module;
a mixer circuit configured to produce the modulated RF signal by modulating the carrier signal according to an output of the first baseband path; and
a first baseband digital predistortion (DPD) module comprising digital circuits and configured to compensate for amplitude-modulation-to-amplitude-modulation (AM2AM) nonlinearities of the first baseband path,
wherein the output of the DEVM correction module is a digital signal, and
wherein the modulation of the carrier signal used to generate the modulated RF signal is performed according to the output of the DEVM correction module.

9. The RF transmitter of claim 8, further comprising:
a second baseband path comprising analog circuits and configured to process an imaginary component of the complex-valued signal generated using the output of the DEVM correction module;
the mixer circuit configured to produce the modulated RF signal by modulating the carrier signal according to the output of the first baseband path and an output of the second baseband path; and
a second baseband DPD module comprising digital circuits and configured to compensate for AM2AM nonlinearities of the second baseband path.

10. The RF transmitter of claim 8, wherein the first baseband DPD module comprises:
an index generation circuit configured to generate an index according to a value of an input signal provided to the first baseband DPD module;
a gain look-up table (LUT); and
a multiplier circuit configured to produce an output value of the first baseband DPD module by multiplying the value of the input signal by a gain value read, using the index, from the gain LUT.

11. The RF transmitter of claim 10,
wherein the index generation circuit produces the index based on an absolute value of the value of the input signal.

12. The RF transmitter of claim 10,
wherein the input signal includes N bits, where N is a natural number greater than 2, and
wherein the index generation circuit produces the index based on an M most significant bits of the input signal, where M is greater than 1 and less than N.

13. A method of operating a Radio-Frequency (RF) transmitter comprising an RF power amplifier, the method comprising:
determining a duration between a start of a transmission of a packet and a transmission of a symbol included in the packet;
determining a gain value according to the duration, the gain value corresponding to an instantaneous variation in the gain of the RF power amplifier;
determining a compensated value for the symbol by multiplying a value of the symbol by the gain value;
determining a modulated RF signal based on the compensated value;
turning on the RF power amplifier at a time corresponding to the start of the transmission of the packet; and
transmitting, using the RF power amplifier and based on the modulated RF signal, a signal corresponding to the symbol.

14. The method of claim 13, wherein the gain value corresponds to the inverse of a normalized gain of the RF power amplifier when the signal corresponding to the symbol is transmitted.

15. The method of claim 13, further comprising determining the gain value according to one or more operational parameters, one or more environmental parameters, or a combination thereof.

16. The method of claim 13, wherein the gain value is determined by selecting a value from a plurality of values in a gain Look-Up Table (LUT).

17. The method of claim 16, further comprising:
selecting, according to one or more operational parameters, one or more environmental parameters, or a combination thereof, the gain LUT from among a plurality of LUTs.

18. The method of claim 16, wherein determining the modulated RF signal based on the compensated value comprises:
selecting, using the compensated value, a nonlinearity correction factor from a plurality of values in a baseband nonlinearity LUT, the plurality of values in a baseband nonlinearity corresponding to an amplitude-modulation-to-amplitude-modulation (AM2AM) nonlinearity of a baseband circuit of the transmitter;
multiplying the compensated value by the baseband circuit nonlinearity correction factor;
processing the result of the multiplication using the baseband circuit; and
determining the modulated RF signal based on an output of the baseband circuit.

19. The method of claim 18, further comprising:
performing a first calibration operation to determine the plurality of values of the baseband nonlinearity LUT; and
after performing the first calibration operation, performing a second calibration operation to determine the plurality of values of the gain LUT.

* * * * *